(12) United States Patent
Shiraishi et al.

(10) Patent No.: US 6,760,194 B2
(45) Date of Patent: Jul. 6, 2004

(54) HEAD GIMBAL ASSEMBLY WITH PIEZOELECTRIC MICROACTUATOR

(75) Inventors: Masashi Shiraishi, Dongguang (CN);
Tamon Kasajima, Dongguan (CN);
Kai Wu, Dongguan (CN); Zhihong Wang, Singapore (SG); Weiguang Zhu, Singapore (SG); Xi Yao, Xpan (CN)

(73) Assignee: SAE Magentics (H.K.) Ltd., N.T. (HK)

( * ) Notice: Subject to any disclaimer, the term of this patent is extended or adjusted under 35 U.S.C. 154(b) by 0 days.

(21) Appl. No.: 10/369,889

(22) Filed: Feb. 19, 2003

(65) Prior Publication Data

US 2003/0123196 A1 Jul. 3, 2003

Related U.S. Application Data

(62) Division of application No. 09/810,821, filed on Mar. 16, 2001, now Pat. No. 6,680,826.

(30) Foreign Application Priority Data

Nov. 28, 2000 (WO) .............................. PCT/CN00/00525

(51) Int. Cl.⁷ ........................... G11B 21/16; G11B 5/48; G11B 21/24; G11B 5/56
(52) U.S. Cl. ................................. 360/244.2; 360/294.4
(58) Field of Search ........................... 360/294.4, 294.6, 360/294.5, 294.3, 294.1, 294, 290, 240, 244.5, 244.9, 244.2

(56) References Cited

U.S. PATENT DOCUMENTS

| 5,898,544 A | | 4/1999 | Krinke et al. ............ 360/264.5 |
| 6,157,522 A | * | 12/2000 | Murphy et al. .......... 360/294.6 |
| 6,249,404 B1 | * | 6/2001 | Doundakov et al. ..... 360/245.4 |
| 6,417,994 B1 | * | 7/2002 | Yim et al. ................ 360/244.6 |
| 6,614,627 B1 | * | 9/2003 | Shimizu et al. .......... 360/294.4 |
| 2001/0055182 A1 | * | 12/2001 | Wu et al. ................ 360/294.4 |

FOREIGN PATENT DOCUMENTS

| EP | 0 582 284 A1 | 8/1993 |
| EP | 0 818 882 A2 | 7/1997 |

* cited by examiner

Primary Examiner—Julie Anne Watko
(74) Attorney, Agent, or Firm—Kenyon & Kenyon

(57) ABSTRACT

A piezoelectric device comprises an integral body of piezoelectric material having a length and width greater than its thickness; wherein the device further includes, in contact with the body, respective pairs of electrodes, wherein the electrodes of each pair are opposed in the thickness direction, wherein the body deflects along said transverse direction when a voltage is applied to the electrode pair. The present invention further provisdes a disk drive suspension and a head gimbal assembly.

6 Claims, 9 Drawing Sheets

HEAD GIMBAL ASSEMBLY WITH PIEZOELECTRIC MICROACTUATOR

This application is a Divisional of patent application Ser. No. 09/810,821, filed on Mar. 16, 2001 (now U.S. Pat. No. 6,680,826).

FIELD OF THE INVENTION

The present invention relates generally to the field of piezoelectric devices, and more particularly, but not by way of limitation, to a piezoelectric actuator suitable for being mounted on the base plate or the load beam of a disk drive suspension and also to a head gimbal assembly (HGA) using the same piezoelectric actuator.

DESCRIPTION OF THE RELATED ART

Magnetic hard disk drive technology continues to advance at a remarkable rate. Bite density has been increased significantly by using advanced head and media technology, whereas the track density still remains at a relatively lower level. To attain higher track densities, extremely accurate track following is required. This can be achieved by both reducing mechanical disturbances and by increasing the servo control bandwidth. The amount of disturbance attenuation achieved by servo systems is proportional to the square of the closed-loop bandwidth. The closed loop bandwidth of a present-day single-stage positioning system with a voice coil motor as the actuator is typically limited to around 1 kHz by the mechanical dynamics of the head stack assembly (HSA). Its capability to compensate the positioning error is roughly limited to 1 micrometer TMR. It is anticipated that several kHz's closed-loop bandwidth will be required to attain the projected track densities, i.e., 25 kTPI, 0.1 micrometer TMR. Dual-stage actuator systems have been proposed as a reasonable solution for attaining such a wide servo-bandwidth. The dual-stage actuator system comprises a conventional voice coil motor as the primary actuator for track seeking, coupled with a secondary micro-actuator for settling and track following.

The structure, performance and mounting location of the secondary actuator are key factors affecting the overall characteristic of the dual-stage servo system. Various microactuators, including piezoelectric, electromagnetic and electrostatic actuators, have been developed to meet this purpose. The devices are designed to be mounted at various locations on an E-block suspension and between the suspension and slider. Taking the inertia of the entire actuator mechanism into consideration, the mounting place of the secondary stage actuator should be as close to the magnetic head as possible. On the other hand, the driving electric/magnetic field of the actuator should not affect the read/write performance of the magnetic head. From this point of view, the optimum location of the secondary actuator will be on the suspension.

One such suspension with piezoelectric actuators is disclosed in U.S. patent application Ser. No. 228,341 (U.S. Pat. No. 6,046,888) filed Jan. 11, 1999 by Todd A. Krinke et. al. entitled Base Plate-mounted Microactuator for a Suspension which is assigned to Hutchinson Technology Incorporated.

However, because of the difference between the current technology and the specifications of the industrial field, such as higher driving voltage, lower mechanical resonance frequency, not enough stroke and so on, there is a continuing need for improved suspensions with micro actuators. Actually, to meet the requirements of the industrial field, the secondary actuator must have at least ±1.3 μm actuation stroke and the mechanical resonance frequency of the whole two-stage actuator system must exceed 13 kHz. In the present invention a piezoelectric microactuator together with the corresponding suspension and head gimbal assembly are proposed to attain the above specifications simultaneously.

SUMMARY OF THE INVENTION

A general object of the present invention is to provide new configurations for a head gimbal assembly (HGA) with a piezoelectric micro actuator, which is capable of quickly and accurately positioning the read/write head for a dual-stage head positioning actuator system of a high-density hard disk drive.

A specific object of the present invention is to provide a planar piezoelectric device, which in a preferred embodiment, can have a relatively small height or thickness, and a relatively large width and length, and can be a part of the suspension to drive the distal end of the suspension, i.e., the slider, moving across data tracks so as to obtain a two stage head positioning servo system with a high servo bandwidth.

Another specific object of the present invention is to provide a head suspension with a stationary proximal end and a moveable distal end, on which, in a preferred embodiment, a piezoelectric actuator of the present invention can be easily mounted to connect the stationary and moveable ends and to drive the distal end of the suspension, i.e., the slider moving across data tracks so as to obtain a two stage head positioning servo system with a high servo bandwidth.

Yet another specific object of the present invention is to provide an electrical connection scheme of driving voltage which can avoid depoling of the piezoelectric actuator so as to attain a large stroke by increasing the driving voltage.

In accordance with one aspect of the present invention, a piezoelectric device comprising an integral body of piezoelectric material which is longer and wider than its thickness is presented. The device is characterised in that it further includes, in contact with the body, respective pairs of electrodes, in that the electrodes of each pair are opposed in the thickness direction, in that the pairs are spaced in a direction transverse to the thickness direction, and in that the integral body is divided into two or more symmetric parts by splitting the electrodes. The body of the piezoelectric device deflects along the transverse direction when a voltage is applied to the electrode pairs. The driving voltage, furthermore, includes two channel control signals that driving the two symmetric parts, respectively. The two channel control signals are wherein they are two opposing phase AC control signals added to the same positive DC bias that has the same direction as the poling vectors of said symmetric parts, in that the two channel signals have a common ground terminal which is connected to the electrode that is affixed to the suspension by conducting adhesive, while the other two terminals of the driving voltage are connected to the top electrodes of the two symmetric parts. The driving voltage make half of these parts expand by $d_{31}$ action while the other half, i.e., their symmetric part contract. This will result in a bending motion of the actuator along the direction of its width.

The preferred actuator is actually a split electrode in-plane bending piezoelectric actuator. Analogous to the term "bimorph", it can be defined as "split-morph".

In accordance with another aspect of the present invention, a disk drive suspension having a load beam that includes a mounting region at a proximal end, a flexure and a slider at a distal end, a rigid region adjacent to a distal end and a spring region between the mounting region and the rigid region is provided. The suspension is wherein it includes slits and slots on the load beam that separate the load beam into a stationary proximal section and moveable distal section, in that each side of the load beam has at least two slits with a slot formed therebetween, and in that the slots extend from different sides of the load beam to join at the center line of the load beam and form a hinge there around which the moveable distal section can pivot. The respective at least two slits and the slot therebetween of the two sides of the load beam form at least two C shape resilient ears coupling the moving section to the stationary section and also it allows the moving section to pivot around the hinge easily.

In a preferred embodiment, a head gimbal assembly includes a piezoelectric actuator of the present invention mounted on a suspension of the present invention to connect the moveable distal section and the stationary proximal section. Furthermore, one of the two longitudinally spaced ends of the actuator is affixed to the stationary section by conducting adhesive or other known means, while another end is affixed to the moveable section. In response to tracking control voltage signals, the microactuator deflects the moving section along a tracking axis with respect to the hinge.

An advantage and novel aspect of the actuator of the present invention is its simple plate like integral structure and the concept of split electrode which enable the actuator to have a small height or thickness and large width, to have two or more parts that are electrically divided by respective pairs of electrodes, and to generate lateral displacement within the electrode plane. With these advantages and features, the actuator can be installed on the load beam of the suspension to position the read/write head to track the runout fast and accurately.

Other objects, as well as the structure and features of the present invention to achieve those objects, will be understood by considering the following detailed description of a preferred embodiment, presented with reference to the accompanying drawings.

DETAILED DESCRIPTION OF THE PREFERRED EMBODIMENT

Hereinafter, basic structures and preferred embodiments of the present invention will be described with reference to the drawings. FIG. 1 through FIG. 8 show the basic structures and the corresponding operations of the actuators of the present invention.

Figure 1:
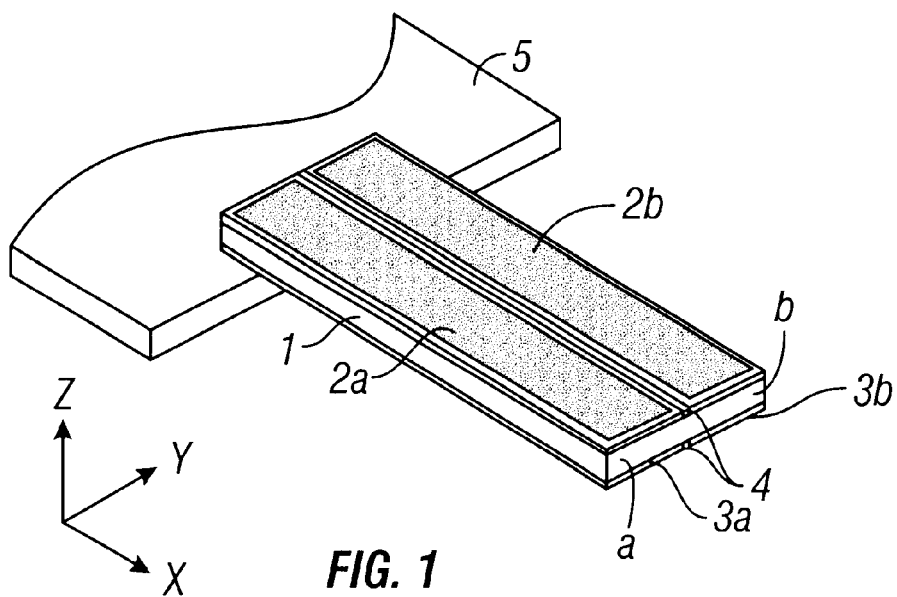
FIG. 1 is a top prospective view of the basic structure of a split-morph piezoelectric device, being an embodiment of the invention.

Referring more particularly to the drawing, FIG. 1 illustrates the basic structure of a split-morph according to an embodiment of the present invention. It includes a single piece of piezoelectric rectangular plate 1 of length, l, width, w, thickness, t and is polarized in the direction of its thickness.

The piezoelectric plate 1 has upper and lower electrodes which are split into two electrically separate parts, a and b, by an intervening gap or crevice 4 where no electrode is applied on piezoelectric plate 1. 2a, 2b and 3a, 3b are pairs of symmetric parts of the upper electrode 2 and the lower electrode 3, respectively, forming a pair of opposed electrodes 2a, 3a; 2b, 3b. The piezoelectric plate 1 is rigidly clamped at one end on a base, which is designated as 5, by adhesive or other known means. The two parts a and b can be poled either in the same direction or opposite to form parallel split-morph or antiparallel split-morph. The driving voltage make one of the two parts a and b expand by $d_{31}$ action while the other part, i.e., their symmetric part contract. This will result in a bending motion of the actuator along the direction of its width.

As shown in FIG. 1, we designate the length direction of the split-morph as the x axis, the width direction as the y axis and the height direction as the z axis. The tip deflection of the split-morph as it moves under the effect of a corresponding driving voltage scheme is then along the y axis. The displacement/voltage sensitivity and resonance frequency of the actuators can be controlled by varying the dimensions of its length l, width w and thickness t.

Figure 2:
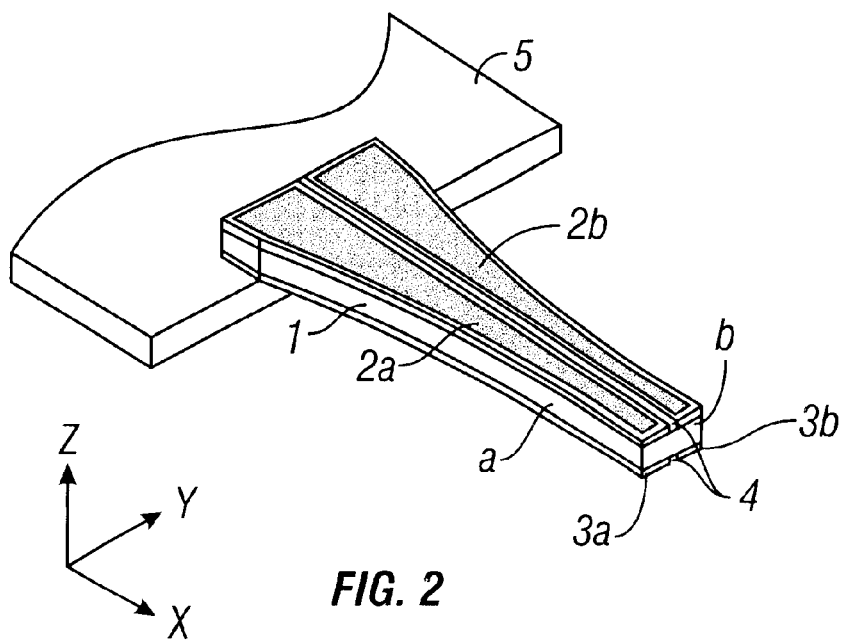
FIG. 2 is a top prospective view of a split-morph with a varying width along the direction of its length.

FIG. 2 illustrates a modification of the basic structure shown in FIG. 1. The only difference is that the width of the piezoelectric plate varies along its length, i.e., the x axis. In FIG. 2, reference numeration is the same as that in FIG. 1. The operation of this actuator is the same as the actuator shown in FIG. 1. Generally, the width of the rigidly clamped end should be larger than that of the tip free end and the shape of width edge can be arbitrarily changed according to its application requirement provided it is symmetrical about a plane of symmetry at the electrode crevice 4. For example, when viewed from the top, the device cantilever beam can have a trapezoidal or other symmetric configuration, for example, the two sides may converge to make an angle.

Figure 3:
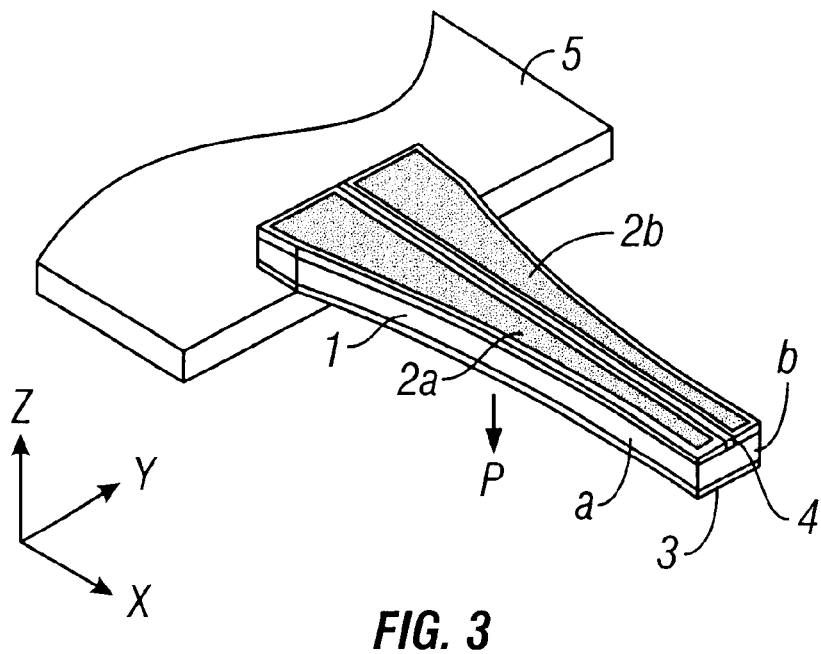
FIG. 3 is a top prospective view of a split-morph, in which only the upper electrode is split into two symmetric parts by a crevice while the lower electrode is a common terminal, generally as a ground of driving voltage.

To simplify the manufacture process and the mounting process, the basic structure shown in FIG. 1 and FIG. 2 can be further modified as shown in FIG. 3. One pair of symmetric parts of the lower electrodes, 3a and 3b, shown in FIG. 1 and FIG. 2, are connected together to form one electrode 3 while the crevice 4 of the upper electrodes 2 remains. The electrode 3 then becomes a common ground terminal of the two channel opposing phase driving voltages. Electrode 3, in an embodiment described hereinafter, can be directly affixed on the suspension by a conducting adhesive. The polarization vector of the piezoelectric element, designated as P, is in a direction from electrode 2 to electrode 3.

To obtain high resonance frequency is a basic requirement of most actuator designs, especially for the secondary stage actuator of the dual-stage actuator system. Generally, the higher an element's flexural rigidity, the higher its first resonance frequency. The resonance frequency of the split-morph in the y direction is much higher than that in the z direction because the width is much larger than the thickness. Although the main motion of split-morph stimulated by applied voltage is along the width direction, it is very easy to excite the vibration along the height direction because it has a much lower flexural rigidity than that of the widthwise direction. It is preferred to increase the rigidity in height direction while maintaining relatively high displacement/voltage sensitivity of the actuator, i.e., large displacement output under relatively low driving voltage. In order to fulfill this purpose, stack and multilayer split-morph is proposed and described below with reference to the drawings.

Figure 4:
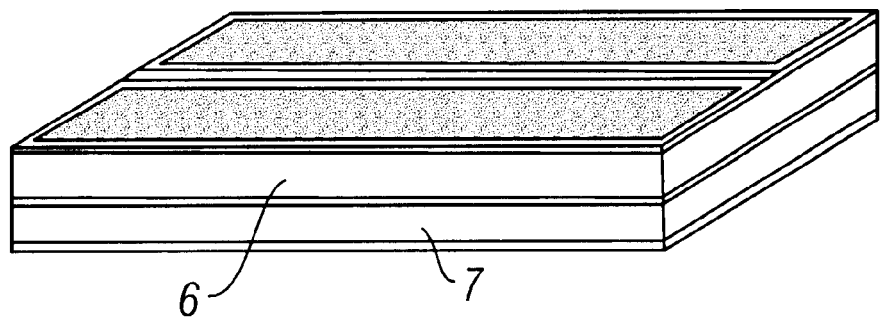
FIG. 4 is a top perspective view of a two layer stacked split-morph.

FIG. 4 shows a two layer stacked split-morph of the present invention. Two thin split-morphs 6 and 7 as described in FIG. 1 through FIG. 3 are bonded together so that the flexural rigidity as well as the strength in the z direction is increased. There are several different configurations of this bi-laminar split-morph due to difference in manufacturing methods. Typical variations and their driving voltage scheme will be depicted below with reference to FIG. 5 through FIG. 8. Arrows shown in these drawings represent polarization directions.

Figure 5:
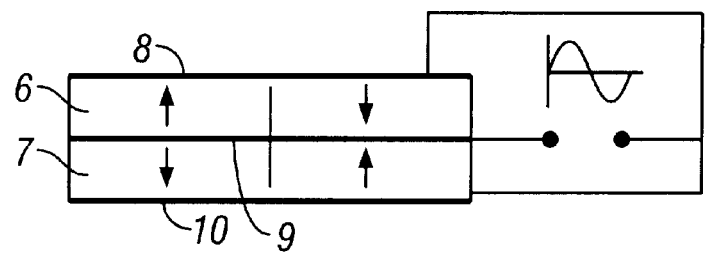
FIG. 5 is a cross-sectional view in the y-z plane of a two layer stacked split-morph comprising two anti-parallel split-morphs and its driving voltage scheme.
Figure 6:
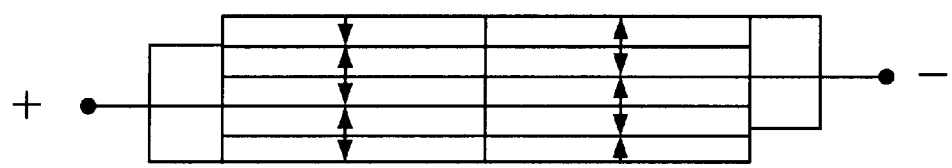
FIG. 6 is a cross-sectional view in the y-z plane of a multilayer split-morph made up of anti-parallel split-morphs and its driving voltage scheme.

In FIG. 5, designated by reference 6 and 7 are two anti-parallel split-morphs, where 8, 9 and 10 are upper, intermediate and lower electrodes, respectively. The polarization vectors of the adjacent parts of 6 and 7 are all opposite in direction. The intermediate electrode 9 is connected to one terminal of the input voltage while the upper and lower electrodes 8 and 10 are connected to the other one. When voltage is applied, parts 6 and 7 can generate a synchronous bending motion. Therefore, this bi-laminar split-morph has similar displacement/voltage sensitivity to the single plate one. Also, an anti-parallel multilayer split-morph related to the bi-laminar split-morph shown in FIG. 5 is proposed in FIG. 6. Their operating mechanisms are the same.

Figure 7A:
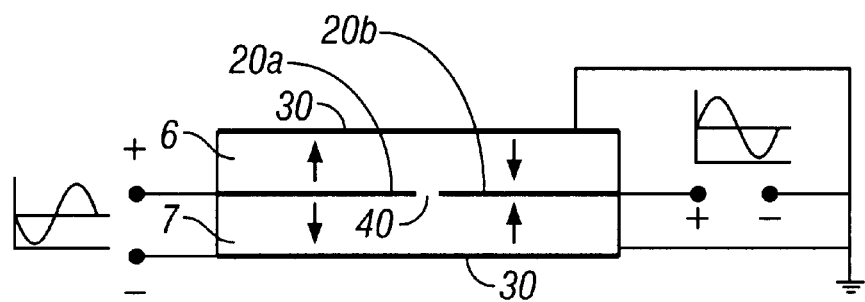
FIG. 7a and FIG. 7b are cross-sectional views in the y-z plane of a two layer stacked split-morph comprising two parallel split-morphs and their driving voltage scheme.
Figure 7B:
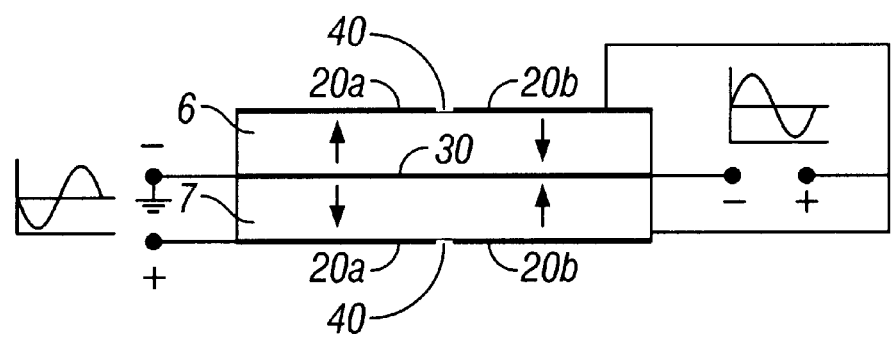
Figure 8:
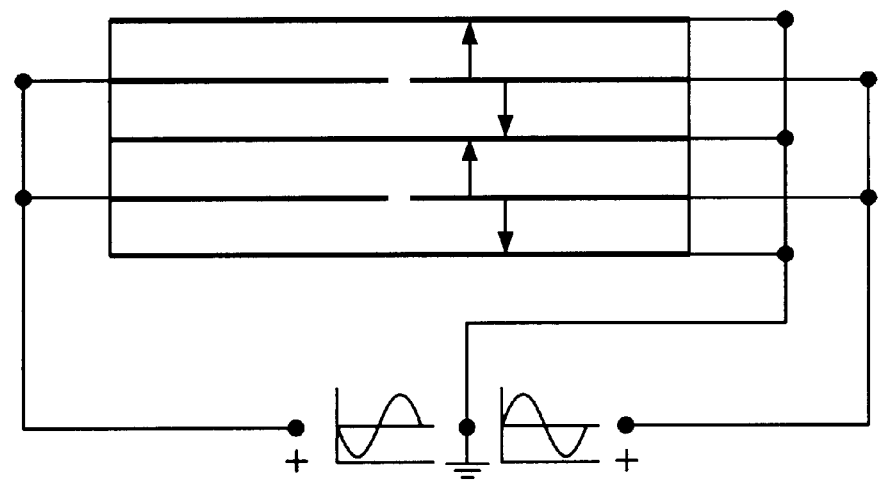
FIG. 8 is a cross-sectional view in the y-z plane of a multilayer split-morph made up of parallel split-morphs and its driving voltage scheme.

FIGS. 7a–b parallel split-morphs shown in FIG. 3 designated as numeral 6 and 7 are bonded together with their polarization vectors opposite to each other. Elements in FIGS. 7a–b function similarly to those shown in FIG. 3 and are labeled with like numerals multiplied by 10. Elements 20a and 20b are two symmetric parts of the electrode in the same layer. Element 40 is electrode crevice. Elements 20a and 20b are connected to the two channel opposing phase driving signals of the input voltage, respectively. Electrode 30 is connected to the common ground of the input voltages. Furthermore, a positive DC bias is applied between the common ground and elements 20a, 20b simultaneously. This configuration can also generate synchronous bending and has the same sensitivity with the configuration shown in FIG. 5. Also, a parallel multilayer split-morph related to the bi-laminar split-morph shown in FIGS. 7a–b is proposed in FIG. 8. Their operating mechanisms are the same.

Because the thickness of the piezoelectric layer is much thinner than the piezoelectric plate, the multilayer split-morph has a higher displacement/voltage sensitivity compared to the single plate one. Of course the multilayer split-morphs can be fabricated by type casting, screen printing and other known thin film techniques and the number of the piezoelectric layers can be different from that shown in the drawings.

The head suspension is another aspect of the present invention.

The well known and widely used suspensions are made up of three components: load beam, base plate and flexure, also known as gimbal. The load beam has a mounting region on a proximal end, a relatively rigid region on a distal end and a spring region between the mounting region and the rigid region. A flexure and a trace for electrical connection are mounted on the rigid region of the load beam. An air-bearing slider which includes the read/write head is mounted to the flexure tongue. The mounting region is typically attached to a base plate for mounting the load beam to an actuator arm. A voice coil motor is used as a primary stage actuator to rotate the actuator arm so as to position the read/write head over desired data tracks on a disk. At the present invention, this kind of suspension is modified on which the secondary actuator can be mounted to form a dual-stage head positioning actuator system.

Figure 9:
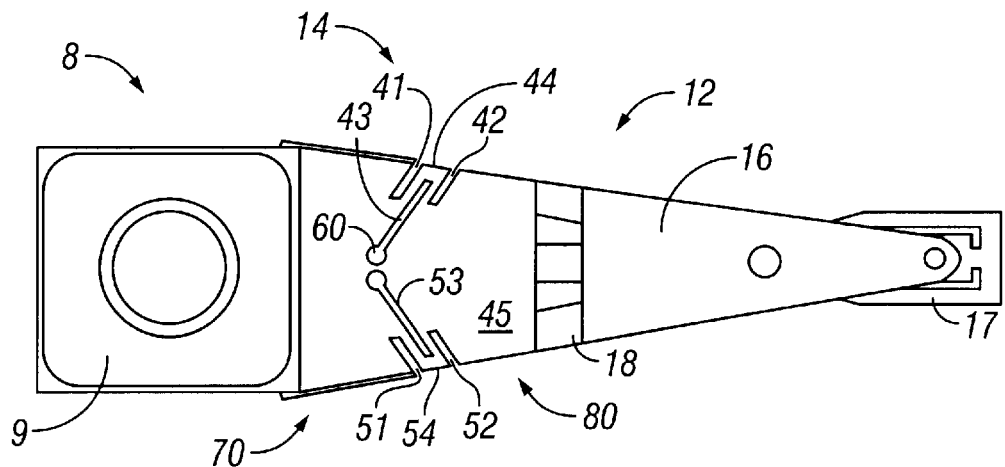
FIG. 9 through FIG. 12 are top views of head suspensions for accommodating a piezoelectric microactuator, in accordance with the present invention.

FIG. 9 illustrates the first embodiment of the suspensions of the present invention. As shown, suspension 8 includes a load beam 12 having an extended mounting region 14 on a proximal end, a relative rigid region 16 on a distal end and a radius or spring region 18 between the mounting region 14 and the rigid region 16. A flexure 17 together with a head slider (not shown) mounted on the tongue of the flexure 17 and a trace (not shown), which includes the electrical connection of the slider, are mounted on the distal end of the rigid region 16. The load beam 12 is mounted on to a base plate 9 through mounting region 14 by welding or any other known processes. Load beam 12 can be fabricated and formed from a sheet of stainless steel in a conventional manner.

The important features of the embodiment will be described in detail with reference to FIG. 9. At one edge of the mounting region 14 there are at least two slits and a slot designated as 41, 42 and 43, respectively. They form together at least one C-shaped resilient ear 44. While at another edge of the mounting region 14 at least two slits and a slot designated as 51, 52 and 53, respectively, form at least another C-shaped resilient ear 54. The slots 43 and 53 extend from each respective edge to encounter at the symmetric line of the load beam and form a hinge 60. The slots 43 and 53 further divide the load beam 12 into a proximal stationary section 70 and a distal moveable section 80. In the embodiment shown in FIG. 9, the moveable section 80 includes flexure and head 17, rigid region 16, spring region 18 and a moving portion 45 of the mounting region 14. The two C-shaped resilient ears couple the moving section 80 to the stationary section 70 and they also allow the moving section 80 to pivot with respect to the hinge 60 easily because of its lower flexural rigidity.

Figure 10:
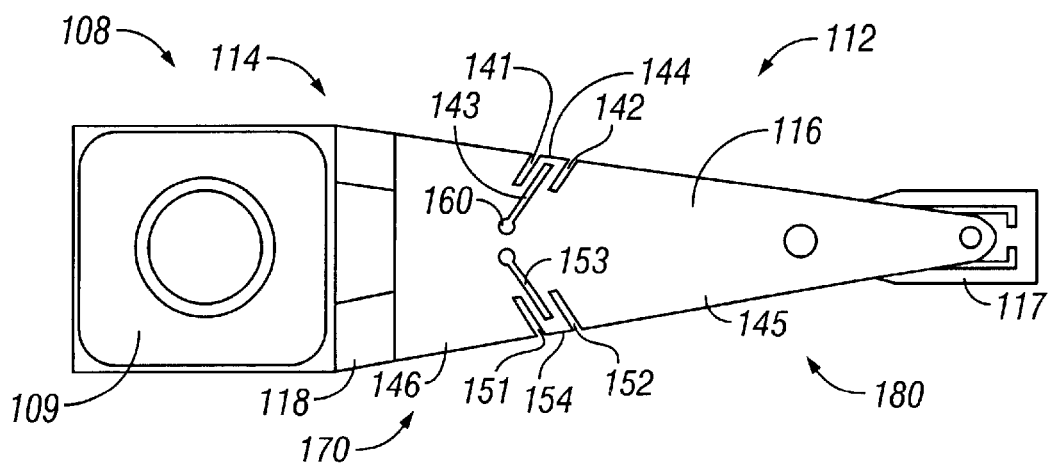

FIG. 10 shows a second embodiment of the suspensions of the present invention. Elements in FIG. 10 which are functionally similar to those of FIG. 9 are shown with like numerals incremented by 100. Designated by numeral 108 is a suspension for accommodating a microactuator. Suspension 108 includes a load beam 112 having a mounting region 114 on a proximal end, a relative rigid region 116 on a distal end and a radius or spring region 118 between the mounting region 114 and the rigid region 116. A flexure 117 together with a head slider (not shown) mounted on the tongue of the flexure 117 and a trace (not shown), which includes the electrical connection of the slider, are mounted on the distal end of the rigid region 116. The load beam 112 is mounted on to a base plate 109 through mounting region 114 by welding or any other known processes. Load beam 112 can be fabricated and formed from a sheet of stainless steel in a conventional manner.

The only difference between the two embodiments shown in FIG. 9 and FIG. 10 is that the C-shaped ears formed on mounting region 14 in FIG. 9 are formed on the rigid region 116 in FIG. 10. At one edge of the rigid region 116 there are at least two slits and a slot designated as 141, 142 and 143, respectively. They form together at least one C-shaped resilient ear 144. While at another edge of the rigid region 116 at least two slits and a slot designated as 151, 152 and 153, respectively, form at least another C-shaped resilient ear 154. The slots 143 and 153 extend from each side of the rigid region to encounter at the symmetric line of the load beam and form a hinge 160. The slots 143 and 153 further divide the load beam 112 into a proximal stationary section 170 and a distal moveable section 180. In the embodiment shown in FIG. 10, the moveable section 180 includes flexure and head 117 and a moving portion 145 of the rigid region 116. The stationary section 170 includes mounting region 114, spring region 118 and the stationary portion 146 of the rigid region 116. The two C-shaped resilient ears coupling the moving section 180 to the stationary section 170 and also they allow the moving section 180 to easily pivot with respect to the hinge 160.

Figure 11:
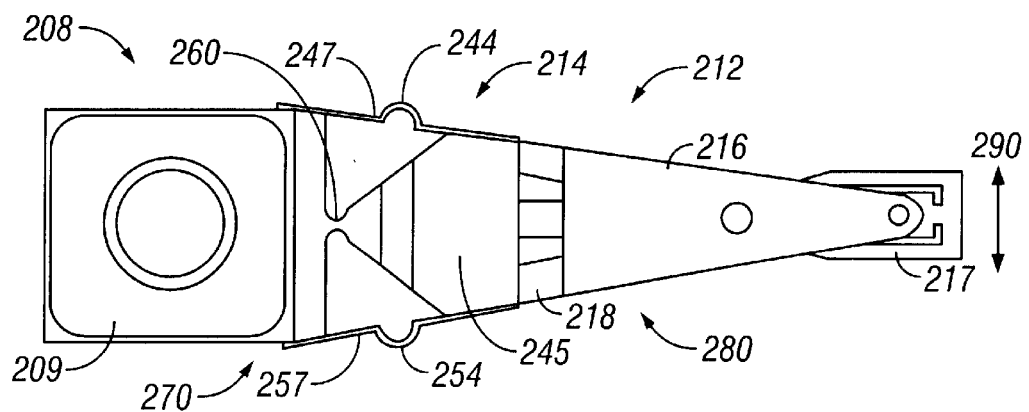

FIG. 11 illustrates a third embodiment of the suspension of the present invention. Elements in FIG. 11 which are functionally similar to those of FIG. 9 are shown with like numerals incremented by 200. Designated by numeral 208 is a suspension for accommodating a microactuator. Suspension 208 includes a load beam 212 having a mounting region 214 on a proximal end, a relative rigid region 216 on a distal end and a radius or spring region 218 between the mounting region 214 and the rigid region 216. A flexure 217 together with a head slider (not shown) mounted on the tongue of the flexure 217 and a trace (not shown), which includes the electrical connection of the slider, are mounted on the distal end of the rigid region 216. The load beam 212 is mounted on to a base plate 209 through mounting region 214 by welding or any other known processes. Load beam 212 can be fabricated and formed from a sheet of stainless steel in a conventional manner.

As shown in FIG. 11, The load beam 212 also comprises a proximal stationary section 270 and a distal moveable section 280. The moveable section 280 includes flexure and head 217, rigid region 216, spring region 218 and a moving portion 245 of the mounting region 214. The moveable section 280 is connected to the stationary section 270 via a hinge 260 and two flange ribs designated as 247 and 257, respectively. On each flange rib there is a C-shaped resilient ear designated as 244 and 254, respectively. The flange ribs with ears act as a pair of leaf springs which have low rigidity in the tracking direction designated as 290 and high rigidity in the other direction. The advantages of the flanges are readily apparent because the in-plane motion of the moveable section 280 pivoting with respect to the hinge 260 is unconstrained while the out-of-plane motion is greatly suppressed.

Figure 12:
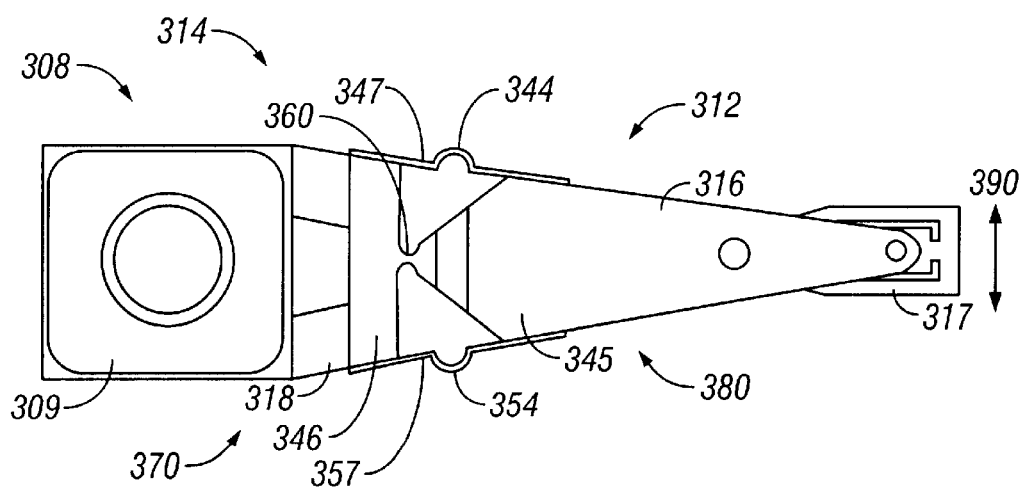

FIG. 12 illustrates a variation of the third embodiment of the suspension of the present invention. Elements in FIG. 12 which are functionally similar to those of FIG. 11 are shown with like numerals incremented by 100. The only difference between the two embodiments shown in FIG. 11 and FIG. 12 is that the flange ribs with ears formed on mounting region 214 in FIG. 11 are formed on the rigid region 316 in FIG. 12. The moveable section 380, therefore, includes a flexure and head 317 and a moving portion 345 of the rigid region 316. The stationary section 370 includes mounting region 314, spring region 318 and the stationary portion 346 of the rigid region 316.

Hereinafter, preferred embodiments of the head gimbal assembly (HGA) with piezoelectric actuator, which is another aspect of the present invention, will be described with reference to FIG. 13 through FIG. 16. In these embodiments the piezoelectric actuators of the present invention, as the secondary fine actuator, are attached to the head suspensions of the present invention.

As described before, for the dual-stage actuator system, one of the ideal mounting locations of the secondary actuator should be on the suspension, and the driving direction of the secondary actuator should preferably be along the tracking direction. Split-morph possesses this property so that it is suitable for mounting on the load beam to finely control the motion of the moveable section of the suspensions.

Figure 13:
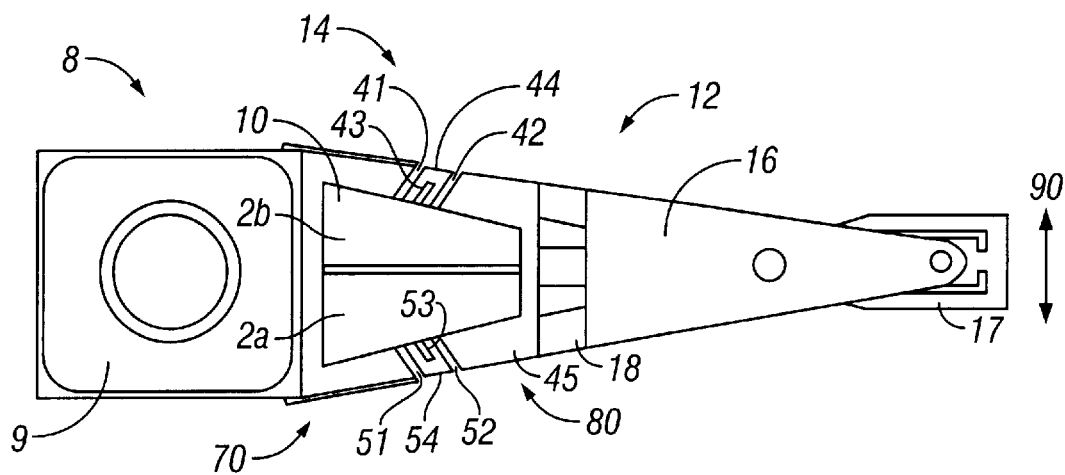
FIG. 13 through FIG. 16 are top views of head gimbal assembly with a piezoelectric microactuator mounted thereon in accordance with the embodiments of the present invention.

FIG. 13 illustrates the first embodiment of the HGA in accordance with the present invention.

A piezoelectric actuator of the present invention shown in FIG. 3, designated by reference 10, is mounted on the head suspension shown in FIG. 9 as the secondary stage fine tracking actuator. Elements shown in FIG. 13 identical to those shown in FIG. 9 are labeled with identical numerals. One of the two longitudinally spaced ends, i.e., one of the two ends along the x axis shown in FIG. 1, of the actuator 10 is affixed to the stationary portion 70 via the lower electrode 3 of actuator 10 by conducting adhesive or other known means, while another end is affixed to the moveable portion 45 of the mounting region 14. The two upper electrodes 2a and 2b of actuator 10 are connected to two electrical leads built in a trace (not shown), respectively. At the terminal of the trace there are electrical contact pads (not shown) to connect electrodes of actuator 10 to a servo control system (not shown). In response to tracking control voltage signals, micro-actuator 10 deflects the moveable section 80 with respect to the hinge 60. Therefore the flexure and slider 17 and the read/write head built in the slider move along a tracking axis 90 at a very high speed for settling and track following. The magnitude of the tracking control signals is controlled by the servo system to control the stroke of the pole tip of the read/write head.

Figure 14:
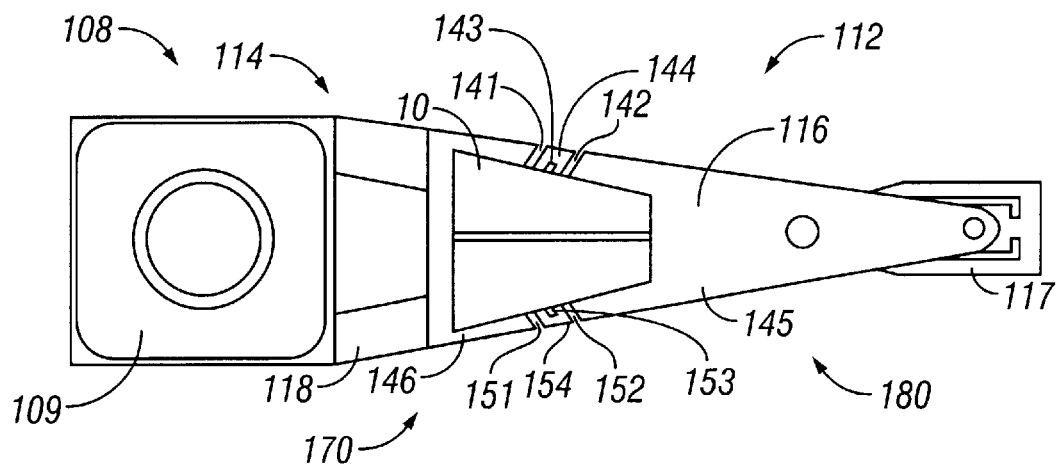
Figure 15:
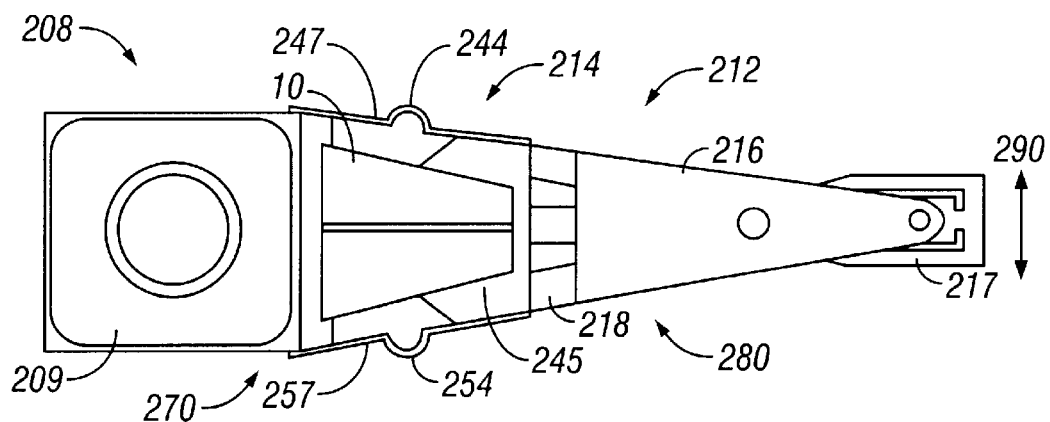
Figure 16:
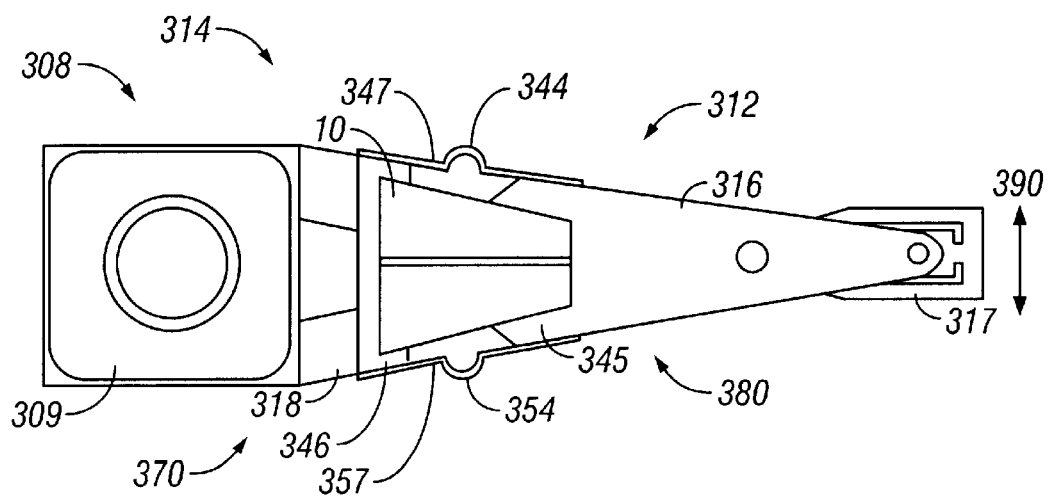

Although the above embodiment is illustrated with the split-morph shown in FIG. 3 and the head suspension shown in FIG. 9, any one of the specific piezoelectric actuators in relation to the present invention shown in FIG. 1 through FIG. 8 can be mounted on the head suspensions shown in FIG. 9 through FIG. 12 as the secondary stage fine tracking actuator to form another embodiments of the head gimbal assembly of the present invention. FIG. 14 through FIG. 16 describe other preferred embodiments. The key point of these embodiments is using the split morph to connect the distal moveable portion and the proximal stationary portion of the suspension. When control voltage signals are applied, the split-morph deflects the moving portion along a tracking axis with respect to the hinge. In these figures the identical numerals to those shown in previous figures designate the identical elements.

Figure 17:
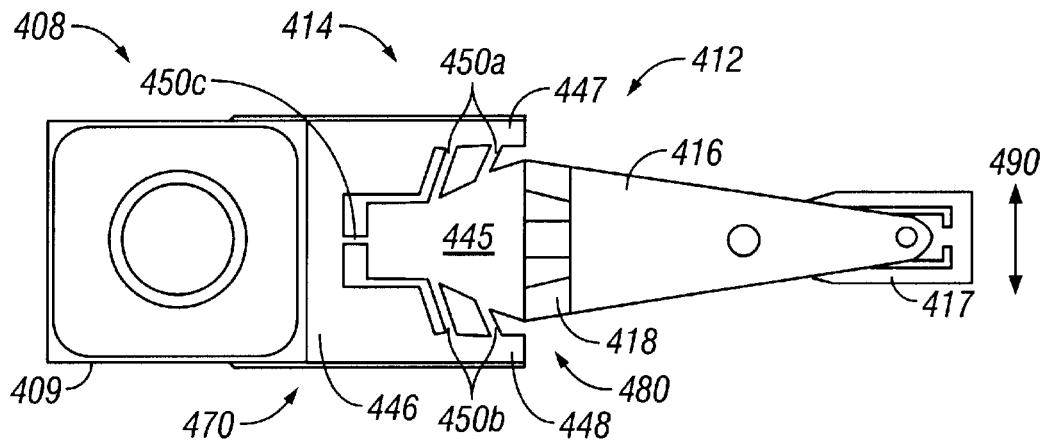
FIG. 17 is a top view of one of the disk drive suspensions according to U.S. Pat. No. 6,046,888.
Figure 18:
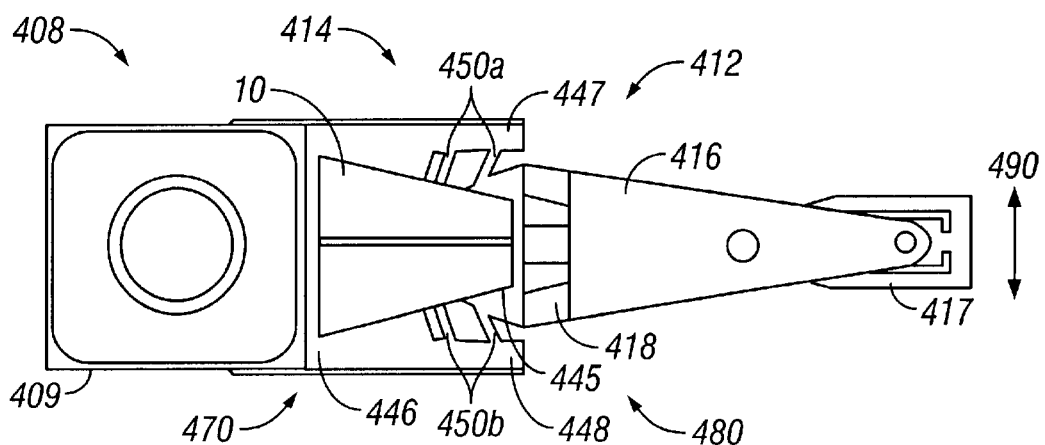
FIG. 18 is a top view of a head gimbal assembly with a split-morph mounted on a disk drive suspension shown in FIG. 17, in accordance with an embodiment of the present invention.

Actually, in addition to the head suspension illustrated in the embodiments of the present invention, the split-morph of the present invention can also be mounted on any type of modification of the existing Watrous-type suspension, providing it includes a proximal stationary section and a distal moveable section with the flexure and slider. FIG. 17 and FIG. 18 illustrate such an embodiment in which a split morph designated as 10 is mounted on a head suspension according to U.S. Pat. No. 6,046,888 by Todd A. Krinke et. al., where the moveable section is driven by two pieces of a normal parallelogram shaped piezoelectric actuator.

Elements in FIG. 17 functionally similar to those shown in FIG. 13 are labeled with like numerals incremented by 400. As shown in FIG. 17, head suspension 408 includes load beam 412 and flexure 417 mounted at a distal end thereof. Head suspension 408 has a stationary section 470 and a moving section 480. Moving section 480 includes flexure 417, rigid region 416, spring region 418, and a moving portion 445 of mounting region 414. Stationary section 470 includes a stationary portion 446 of mounting region 414, first longitudinally extending arm 447 and second longitudinally extending arm 448. Moving portion 445 of mounting region 414 is suspended between arm 447 and 448 by support beams 450a, 450b, and 450c. Load beam 412 is further mounted to an existing base plate 409 in a conventional manner. In an embodiment using the head suspension in U.S. Pat. No. 6,046,888, two piezoelectric elements connect the first arm 447 and the second arm 448 to moving portion 445, respectively, to shift flexure 417 and therefore the slider along tracking axis 490.

In the embodiment shown in FIG. 18 of the present invention, only one piece of split-morph shown in FIG. 3 is mounted on load beam 412 to shift moveable section 480 therefore the slider for settling and track following. One of the two longitudinally spaced ends of the split-morph 10 is affixed to the stationary portion 446 of mounting region 414 via the lower electrode 3 of actuator 10 by conducting adhesive or other known means, while another end is affixed to the moveable portion 445 of the mounting region 414. The operation of the actuator 10 is the same as the embodiment described in FIG. 13.

Also, any one of the specific split-morphs in relation to the present invention shown in FIG. 1 through FIG. 8 can be mounted on the head suspensions disclosed in U.S. Pat. No. 6,046,888 to get better performances of resonance frequency and stroke than that of the head gimbal assembly claimed therein.

The advantages of the proposed HGA are readily apparent. In addition to providing a secondary fine actuator with large stroke and higher resonance frequency and therefore attaining higher track density, only one piece of piezoelectric actuator will help tremendously in decreasing the cost of the HGA, simplifying the assembly process and most important keeping the resonance frequency of the HGA at a fixed range in order that a notch filter can be used in the head positioning servo control system.

Although the HGA of the present invention is illustrated by embodiments of hard disk drives, apparently, it is also applicable to an optical disk and other non-magnetic disks for obtaining a high compact feature.

Although the present invention has been described with reference to preferred embodiments, various modifications may occur to one skilled in the art without departing from the spirit of the invention. Accordingly, the present invention is not limited to the embodiments as described in details herein and as shown in the accompanying drawings.

What is claimed is:

1. A disk drive suspension comprising:

a load beam formed as a one piece, unitary member from a single sheet of resilient metal including:
  a mounting region at a proximal end of the load beam;
  a rigid region at a distal end of the load beam;
  a spring region between the mounting region and the rigid region;

a flexure together with a trace mounted at the distal end of said rigid region of the load beam and configured for supporting and electrically connecting a read/write head; and a base plate for mounting said load beam:

wherein
  said load beam is divided into a proximal stationary section and a distal moving section with said flexure and read/write head;
  a slit and slot separating the distal moving section from the proximal stationary section;
  said moving section can pivot with respect to a hinge at the longitudinally symmetric line of the load beam; and
  said hinge is a joint between said proximal stationary section and said distal moving section.

2. A disk suspension set forth in claim 1, wherein the slot has a first slot and a second slot extending from respective edge of the load beam to encounter at the longitudinally symmetric line of the load beam and form said hinge.

3. A disk drive suspension set forth in claim 2, wherein the slit includes a first pair of slits sandwiching the first slot and a second pair of slits sandwiching the second slot.

4. A disk drive suspension set forth in claim 3, wherein the first pair of slits and the first slot formed therebetween form a first C-shaped resilient ear coupling said distal moving section to said proximal stationary section at one edge and the second pair of slits and the second slot formed therebetween form a second C-shaped resilient ear coupling said distal moving section to said proximal stationary section at another edge, wherein said C-shaped ears enable said distal moving section to pivot with respect said hinge.

5. A disk suspension set forth in claim 1, wherein said slit and slot are located at said mounting region at the proximal end of the load beam.

6. A disk suspension set forth in claim 1, wherein said slit and slot are located at said rigid region at the distal end of the load beam.

* * * * *

UNITED STATES PATENT AND TRADEMARK OFFICE
CERTIFICATE OF CORRECTION

PATENT NO. : 6,760,194 B2
DATED : July 6, 2004
INVENTOR(S) : Masashi Shiraishi et al.

It is certified that error appears in the above-identified patent and that said Letters Patent is hereby corrected as shown below:

Title page,
Item [75], Inventors, "Masashi Shiraishi, Dongguang (CN)" should be -- Masashi Shiraishi, Dongguan (CN) --
Item [73], Assignee, "SAE Magentics (H.K.) Ltd., N.T. (HK)" should be -- SAE Magnetics (H.K.) Ltd., N.T. (HK) --
Item [57], ABSTRACT,
Line 8, "provisdes" should be -- provides --

Column 5,
Lines 54-56, "FIGS. 7a-b parallel split-morphs shown in FIG. 3 designated as numeral 6 and 7 are bonded together with their polarization vectors opposite to each other." should be -- FIGS. 7a-b, show[s] another configuration of bi-laminar split-morph. In FIGS. 7a-b, two parallel split-morphs shown in FIG. 3 designated as numeral 6 and 7 are bonded together with their polarization vectors opposite to each other. --

Column 10,
Line 51, "respect said hinge." should be -- respect to said hinge. --

Signed and Sealed this

Seventh Day of June, 2005

JON W. DUDAS
*Director of the United States Patent and Trademark Office*